United States Patent
Edelstein et al.

(10) Patent No.: US 7,273,770 B2
(45) Date of Patent: Sep. 25, 2007

(54) COMPLIANT PASSIVATED EDGE SEAL FOR LOW-K INTERCONNECT STRUCTURES

(75) Inventors: Daniel C. Edelstein, White Plains, NY (US); Lee M. Nicholson, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/464,959

(22) Filed: Aug. 16, 2006

(65) Prior Publication Data

US 2006/0281224 A1 Dec. 14, 2006

Related U.S. Application Data

(62) Division of application No. 10/707,713, filed on Jan. 6, 2004, now Pat. No. 7,098,544.

(51) Int. Cl.
H01L 21/50 (2006.01)
H01L 21/48 (2006.01)
H01L 21/44 (2006.01)
H01L 23/31 (2006.01)

(52) U.S. Cl. .................. 438/126; 438/127; 438/124; 257/E23.133; 257/E23.131; 257/E23.126

(58) Field of Classification Search ................ 438/124, 438/126, 127; 257/E23.131, E23.133, E23.126
See application file for complete search history.

(56) References Cited

U.S. PATENT DOCUMENTS 3,700,497 A 10/1972 Epifano et al.
4,017,340 A 4/1977 Yerman
4,331,970 A 5/1982 Yerman (Continued)

FOREIGN PATENT DOCUMENTS

JP 359072745 4/1984

(Continued)

OTHER PUBLICATIONS

Reed, et al. in "Compliant wafer level package (CWLP) with embedded air-gaps for sea of leads (SoL) interconnections," Proc. of IEEE 2001 International Interconnect Technology Conference, pp. 151-153.

(Continued)

*Primary Examiner*—Luan Thai
(74) *Attorney, Agent, or Firm*—Yuanmin Cai; Lisa U. Jaklitsch

(57) ABSTRACT

A structure for a chip or chip package is disclosed, with final passivation and terminal metallurgy which are mechanically decoupled but electrically coupled to the multilayer on-chip interconnects. This decoupling allows the chip to survive packaging stresses in the final passivation region, with strain relief from the decoupling region and compliant leads therein, so that on-chip interconnect levels do not feel these external packaging or other stresses. This structure is particularly preferred for on-chip interconnects consisting of Cu and low-k dielectric, the latter having inferior mechanical properties relative to $SiO_2$. The decoupled region extends over all chips on the wafer. It may also extend into the edgeseal or dicing channel region so as to allow chip dicing and retention of this mechanical decoupling all around every chip on the wafer.

15 Claims, 3 Drawing Sheets

U.S. PATENT DOCUMENTS

| | | |
|---|---|---|
| 5,008,213 A | 4/1991 | Kolesar, Jr. |
| 5,198,963 A | 3/1993 | Gupta et al. |
| 5,287,003 A | 2/1994 | Van Andel et al. |
| 5,310,965 A | 5/1994 | Senba et al. |
| 5,665,655 A | 9/1997 | White |
| 5,679,977 A | 10/1997 | Khandros et al. |
| 5,739,585 A | 4/1998 | Akram et al. |
| 5,742,094 A | 4/1998 | Ting |
| 5,786,632 A | 7/1998 | Farnworth et al. |
| 6,191,492 B1 | 2/2001 | Yamazaki et al. |
| 6,271,578 B1 | 8/2001 | Mitwalsky et al. |
| 6,368,899 B1 | 4/2002 | Featherby et al. |
| 6,372,527 B1 | 4/2002 | Khandros et al. |
| 6,383,893 B1 | 5/2002 | Begle et al. |
| 6,538,214 B2 | 3/2003 | Khandros |
| 6,552,426 B2 | 4/2003 | Ishio et al. |
| 6,555,906 B2 * | 4/2003 | Towle et al. ............... 257/723 |
| 6,583,516 B2 | 6/2003 | Hashimoto |
| 6,709,898 B1 * | 3/2004 | Ma et al. ................... 438/122 |
| 6,882,045 B2 | 4/2005 | Massingill et al. |
| 2002/0117759 A1 | 8/2002 | Bauch et al. |
| 2002/0127776 A1 | 9/2002 | Nakajo et al. |
| 2003/0122220 A1 | 7/2003 | West et al. |
| 2003/0137062 A1 | 7/2003 | Akram et al. |
| 2003/0222330 A1 | 12/2003 | Sun et al. |
| 2004/0008947 A1 | 1/2004 | Yamabayashi et al. |
| 2004/0063237 A1 | 4/2004 | Yun et al. |
| 2004/0088855 A1 | 5/2004 | Akram |
| 2004/0102022 A1 | 5/2004 | Jiang et al. |

FOREIGN PATENT DOCUMENTS

| | | |
|---|---|---|
| JP | 405335482 | 12/1993 |

OTHER PUBLICATIONS

M.S. Bakir, et al., Sea of Leads Microwave Characterization and Process Integration With FEOL and BEOL, Proc. of IEEE 2002 International Interconnect Technology Conference, pp. 116-118.

A. Mule, et al., "Optical Waveguides With Embedded Air-Gap Cladding Integrated Within a Sea-of-Leads (SoL) Wafer-Level Package," Proc. of IEEE 2002 International Interconnect Technology Conference, p. 122-124.

"Chip Pad Process," IBM Technical Disclosure Bulletin, Oct. 1991.

"Via Reliability Problem Eliminated by an Offset Elliptical Via," IBM Technical Disclosure Bulletin, Jan. 1998, pp. 310-311.

"Structure for the Passivation of Semiconductor Chips," IBM Technical Disclosure Bulletin, Aug. 1973, p. 728-729.

* cited by examiner

COMPLIANT PASSIVATED EDGE SEAL FOR LOW-K INTERCONNECT STRUCTURES

CROSS REFERENCE TO RELATED PATENT APPLICATIONS

This patent application is a divisional of U.S. patent application Ser. No. 10/707,713 which was filed on Jan. 6, 2004 now U.S. Pat. No. 7,098,544.

FIELD OF THE INVENTION

This invention relates generally to interconnect structures for high-speed microprocessors, application specific integrated circuits (ASICs), and other high speed ICs, and more specifically, to a compliant passivated edge seal for low-k interconnect structures. This invention provides computer chips with improved mechanical integrity in the assembly and packaging, and also provides many additional advantages which shall become apparent as described below.

BACKGROUND OF THE INVENTION

In semiconductor fabrication, insulating, semiconducting, and conducting layers are formed on a substrate. The layers are patterned to create features and spaces, forming devices, such as transistors, capacitors and resistors. These devices are then interconnected to achieve a desired electrical function, thereby producing an integrated circuit (IC). The formation and patterning of the various device layers are achieved using conventional fabrication techniques, such as oxidation, implantation, deposition, epitaxial growth of silicon, lithography, etching and planarization.

To increase throughput, a plurality of ICs are fabricated on a wafer in parallel. Thus, for example, a wafer may contain multiple IC units which have been formed on the planar surface area of the wafer. Each IC is a self contained entity surrounded by its own boundary region using orthogonal axes that are referred to as dicing channels or scribe lanes. Generally, these channels may have a width of about 50 to 100 μm. The ICs are typically separated into individual chips or 'die' by cutting in this channel in a process known as 'dicing' or 'singulation'. Conventional dicing techniques include sawing with a diamond wheel, laser cutting, and "scribe and break". As the dicing tool cuts or scribes the wafer, chips and cracks in the surface and substructure often result. Such cracks can propagate into critical areas within the IC in response to packaging stresses, and may cause permanent circuit failure.

To increase chip performance, wiring capacitance is reduced by changing from the industry-standard dielectric material $SiO_2$ (having a relative dielectric constant of about 4.0) to lower dielectric constant ("low-k") insulators surrounding the interconnects. These low-k materials come at a significant disadvantage of loss of mechanical properties such as hardness and elastic modulus, and other forms of robustness and resistance to failure due to internal and external stresses. In particular, it has become a problem to probe, dice, and package chips containing low-k insulators without causing fracture, chipping or cracking of the dielectric material, and pullout of the terminal metal pads. There is therefore a need to isolate these weak on-chip materials from the harsh external environment and stresses associated with assembly and packaging.

Typical prior art approaches have adopted a hard dielectric passivation layer such as a silicon nitride material. For example, U.S. Pat. No. 5,742,094 discloses a sealed semiconductor chip. A hermetic seal consisting of a thin SiN passivation layer and a Ni passivation layer is selectively deposited on the chip surface. It has been observed, however, that when a low-k dielectric material is used as the inter-metal dielectric within the active area of the chip, such hard passivation layers do not adequately protect the device from fracture, chipping or cracking of the dielectric material, and pullout of the terminal metal pads.

Other prior art approaches combine a hard dielectric passivation layer such as a silicon dioxide or silicon nitride with an overcoat of a more compliant material such as a polyimide. For example, U.S. Pat. No. 6,383,893 discloses a hard passivation layer (124) consisting of inorganic insulators such as $SiO_2$ or SiN covering the wafer, and a soft passivation layer (125) consisting of polyimide overlying the hard passivation layer. U.S. Pat. No. 6,271,578 discloses a similar structure. Again, it has been observed that when a low-k dielectric material is used as the inter-metal dielectric within the active area of the chip, a hard passivation layer in contact with the active device area does not adequately protect the device from fracture, chipping or cracking of the dielectric material, and pullout of the terminal metal pads. The soft passivation layer overlying the hard passivation layer fails to alleviate this problem.

Another prior art approach disclosed in U.S. Pat. No. 5,665,655 involves the use of a crackstop structure, specifically a groove surrounding the active region on a chip. In this structure, a dielectric material (3) which can be polyimide is deposited over the substrate including the active device regions, and then a hard passivation layer (11) of, for example, silicon nitride is deposited over the structure. When the dicing operation is performed, however, the sidewalls of the chip remain in contact with the substrate material, which is typically a semiconductor material such as silicon. Microcracks occurring in silicon substrates tend to propagate very rapidly, and would therefore lead to failures in the adjacent low-k dielectric material. Thus, this structure also fails to protect the device from fracture, chipping or cracking of the dielectric material, and pullout of the terminal metal pads.

Therefore, a need remains in the art for a structure and process to isolate the weak on-chip materials from the harsh external environment and stresses associated with assembly and packaging.

SUMMARY OF THE INVENTION

The aforementioned problems are addressed by the structure and method of this invention. Specifically, in one aspect this invention is directed to a semiconductor wafer comprising a substrate; a plurality of integrated circuits fabricated on the substrate; a dicing channel disposed between adjacent ones of the integrated circuits, the channel exposing sidewalls of the integrated circuits; a layer of first dielectric material disposed on a top surface and sidewalls of the integrated circuits; and a layer of second dielectric material disposed on the layer of first dielectric material, wherein the first dielectric material has a critical strain energy release rate, $G_c$ at least about 10 times greater than the second dielectric material. The first dielectric material preferably also has a tensile strength of about 20 to 100 MPa.

In another aspect, this invention is directed to a method of forming an edge seal structure on an integrated circuit chip formed on a substrate. The method comprises: etching a channel in a kerf region surrounding the integrated circuit chip, thereby exposing sidewalls of the integrated circuit chip; depositing a planarizing layer of first dielectric material on the integrated circuit chip and in the channel; and depositing a second dielectric material over the first dielectric material, wherein the first dielectric material has a $G_c$ value at least about 10 times greater than the second dielectric material.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DESCRIPTION OF THE INVENTION

The invention involves a structure and method to generate a mechanical isolation region between the final on-chip interconnect level and the terminal pads and dicing channel of the chip, while still providing electrical continuity through this region via flexible connections. The isolation material and flexible electrical feed-throughs allow for strain relief and shock absorption without permanent damage to the chip wiring levels.

Figure 1:
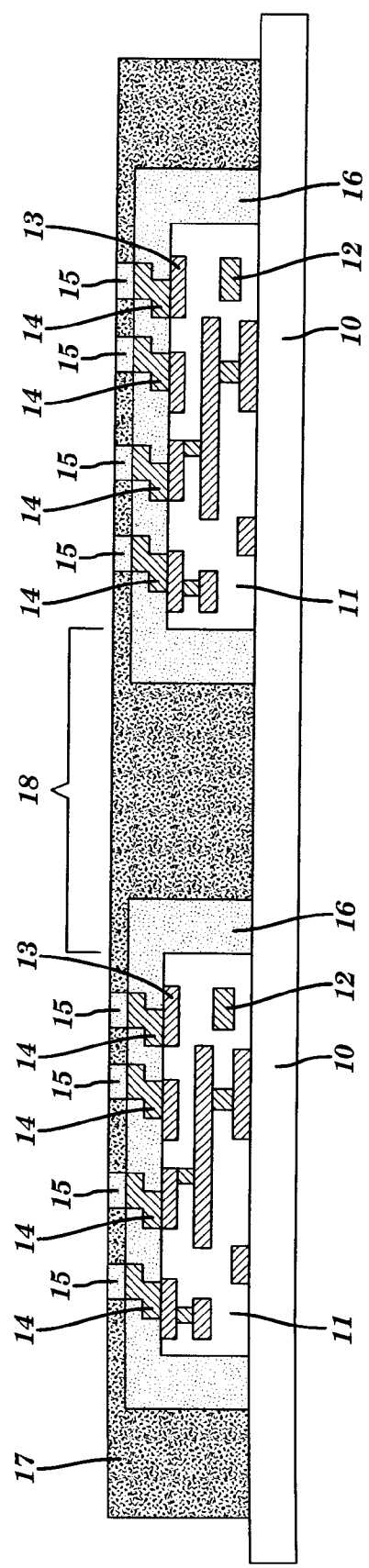
FIG. 1 illustrates an embodiment of the present invention in which final passivation and compliant layers terminate perpendicular to and onto the substrate.

FIG. 1 illustrates one embodiment of the invention. In the structure shown in FIG. 1, integrated circuit (IC) 11 has been formed on substrate 10. IC 11 comprises the active device regions of the chip (not shown), interconnect wiring 12, and metal pads 13. Surrounding the IC is a layer 16 of energy absorbing material which is capable of absorbing mechanical stresses imparted onto the IC 11 during assembly and packaging. A final passivation layer 17 is disposed over the layer 16 to hermetically seal the chip prior to dicing. Embedded in layer 16 are a plurality of conductive leads 14 connecting the metal pads 13 with bonding pads 15. Leads 14 may be jogged or staggered, as shown, or they may be straight. The energy absorbing material 16 contacts the sides of IC 11, in addition to the top surface of IC 11.

The energy absorbing layer 16 and the final passivation layer 17 should each be passivated, i.e., formed of dielectric material. In addition, the energy absorbing material 16 should be compliant yet tough. This material may be characterized by fracture toughness, which may be defined as a material's ability to resist the propagation of a crack within itself. The parameter $G_c$ is known as the critical strain energy release rate, or the energy at which a crack will propagate. $G_c$ has units of $kJ/m^2$, and is often referred to as the fracture toughness of a material. Another parameter that is frequently encountered when quantifying the fracture toughness of a material is the critical stress intensity factor, $K_c$. The relationship between $G_c$ and $K_c$ is as follows: $G_c=K_c^2/E$ for plane stress and $G_c=K_c^2(1-v^2)/E$ for plane strain, where v is Poisson's ratio. $K_c$ has unit of $MPa-m^{1/2}$. Low values of $G_c$ and $K_c$ are indicative of low fracture toughness. Materials having low fracture toughness typically will exhibit brittle failure. High values of $G_c$ and $K_c$ are indicative of high fracture toughness, where failure modes are likely to be ductile.

One may record the stress-strain curve for a given set of materials in a static tensile test at constant temperature and strain rate as performed in accordance with ASTM methods. Those materials that exhibit low fracture toughness typically exhibit brittle failure and will fail at very low strains in the region of 1-3%. Those materials that exhibit some degree of yield or elongation to break will fail at high strains>10% and are typical of materials with high fracture toughness and ductile failure modes. Thus, the energy absorbing material 16 preferably has a fracture toughness which is at least about 10 times greater than the fracture toughness of the final passivation layer 17. The energy absorbing material 16 preferably has a $G_c$ greater than about 0.1 $kJ/m^2$, and more preferably in the range of about 0.5 to 2.5 $kJ/m^2$. The final passivation layer 17 preferably has a $G_c$ less than about 0.05 $kJ/m^2$, and more preferably in the range of about 0.005 to 0.05 $kJ/m^2$.

The energy absorbing material 16 also may be characterized by tensile strength. The tensile strength or ultimate tensile strength of a material may be defined as the maximum stress the material under load can attain prior to failure. Tensile strength is typically expressed in units of MPa ($MN/m^2$). One may record the stress-strain curve in a static tensile test at constant temperature and strain rate as performed in accordance with ASTM methods, and from this plot mark the tensile strength as previously defined. Those materials that exhibit low tensile strength typically experience brittle failure and will fail at very low strains in the region of 1-3%. Those materials that exhibit some degree of yield or elongation to break will fail at high strains>10% and typically have high tensile strength and ductile failure modes. The yield stress, $\sigma_y$, may be reported to indicate a material's strength and is a very different point on the stress-strain curve. Some materials yield or "neck down" when under load; this is exhibited as a maximum in the stress-strain curve followed by a slight drop in stress for constant strain. The material may then continue to carry load with only a gradual increase in stress with increase in strain (known as elongation) until failure occurs. The energy absorbing material 16 preferably has a tensile strength of about 20 to 100 MPa, while the final passivation layer 17 preferably has a tensile strength of about 700 to 10,000 MPa.

Any material exhibiting the above described characteristics may be used for the energy absorbing material 16. Preferred materials are largely organic in nature, and include: polyesters, phenolics, polyimides, polysulfones, polyether ether ketones, polyurethanes, epoxies, polyarylene ethers, polyethylene terephtalates. For example, polystyrene has a $G_c$ value of 1-2 $kJ/m^2$, and a tensile strength of 0.08 GPa. Other examples include polymethyl methacrylate with a $G_c$ value of 0.2-0.6 $kJ/m^2$ and a $K_c$ of 1.5 $MPa-m^{1/2}$, and polyethylene with tensile strength of 0.05 GPa. A particularly preferred energy absorbing material is polyarylene ether known as SiLK™, available from Dow Chemical, and having a fracture toughness, $K_c$, of 0.62 $MPa-m^{1/2}$. An additional benefit of SiLK and some of the polyimides is thermal stability to relatively high temperatures such as from 350C to 450C; these materials would survive all subsequent processing involved in the chip fabrication or packaging.

The final passivation layer 17 may be formed of any material exhibiting the above described characteristics. Preferred materials are largely inorganic in nature, and include: silicon-based glasses such as SiN and $SiO_2$, SiC, tetraethylorthosilicate (TEOS), fluorinated TEOS (FTEOS), fluorinated silicate glass (FSG), and organosilicate glass (OSG). A particularly preferred material for the final passivation layer is $SiO_2$, having a tensile strength of 5900 MPa.

One skilled in the art will recognize that the energy-absorbing material and final passivation layer may be characterized by other material properties such as Young's modulus and hardness. Preferred materials for the final passivation layer include $Si_3N_4$, with modulus ranging from about 174 GPa to about 290 GPa and hardness of about 13.5 GPa; PECVD silane oxide with modulus of about 60 GPa and hardness of about 6.8 GPa; and fused silica with modulus of about 72 GPa and hardness of about 8.7 GPa. The energy-absorbing material should generally have modulus and hardness values approximately two orders of magnitude lower than those for the final passivation layer. For example, SiLK™ has a modulus of about 3.5 GPa and hardness of about 0.21 GPa.

The structure shown in FIG. 1 may be formed by the following method. A wafer comprising a plurality of ICs 11 is completed through processing of the final metal level, for example by copper/low-k dual damascene processing. The final metal level includes metal pads 13 to connect subsequently to terminal pads 15 for wirebond, C4 or direct pin creation.

Next, a channel is defined by conventional techniques, such as by photolithography, and is etched in the kerf region surrounding each chip 11. The channel is etched through the various layers residing on substrate 10, but is not etched through substrate 10. A planarizing layer of energy-absorbing material 16 is deposited, preferably spun on and cured, so as to fill the etched channels and to provide a planarized layer of this material over all active chip areas 11. Material layer 16 preferably has a thickness of about 1 to about 5 µm.

Contact holes are then created in the material layer 16 down to the metal pads 13. These holes may be created, for example, by photolithography and etching. Alternatively, if the material 16 is a photosensitive polyimide, then these holes may be directly patterned and etched. S-shaped or spring-shaped compliant leads 14 may be created which make contact with the exposed metal pads and rise up the side of the tapered holes in the material 15. For example, leads 14 may be created using the techniques disclosed by Hollie A. Reed et al. in "Compliant wafer level package (CWLP) with embedded air-gaps for sea of leads (SoL) interconnections," Proc. of IEEE 2001 IITC, pp. 151-153, the disclosure of which is incorporated herein by reference. As another example, leads 14 may be formed using the techniques disclosed by Khandros et al. in U.S. Pat. Nos. 6,372,527 or 6,538,214 or 5,679,977, the disclosures of which are incorporated herein by reference.

Formation of leads 14 include the steps of sputtering a release layer and seed layer in the contact holes, forming a photomask over the material 16, through-mask plating of the compliant leads 14, removing the resist, and stripping the exposed seed layer and release layer. Optionally, a second polymer layer (not shown) may be reflowed into the contact holes to plug the holes around the compliant leads. Leads 14 may be formed of any suitable metal, such as copper, aluminum, or tungsten.

Jogged leads 14 must be fabricated in two sequential stages. After the material 16 has been deposited, a suitable hardmask scheme may be employed to enhance the lithography of the via level of the jogged leads 14. The via level is defined using conventional lithography and etching techniques, followed by metallization and cap deposition. A second deposition of material 16 then may be applied and the line level of the jogged leads 14 may be defined using similar techniques, with an engineered offset as shown in FIG. 1.

Next, the final passivation layer 17 is deposited. Layer 17 may comprise, for example, about 0.5 µm each of $SiO_2$ and $Si_3N_4$. Contact holes for terminal pads 15 are then formed using, for example, photolithography and etching. Metallurgy for terminal pads 15 is deposited in the contact holes, contacting the compliant leads 14 and plugging the contact holes through the final passivation layer 17. The wafer may then be diced and the individual chips may be packaged according to conventional processes.

Figure 2:
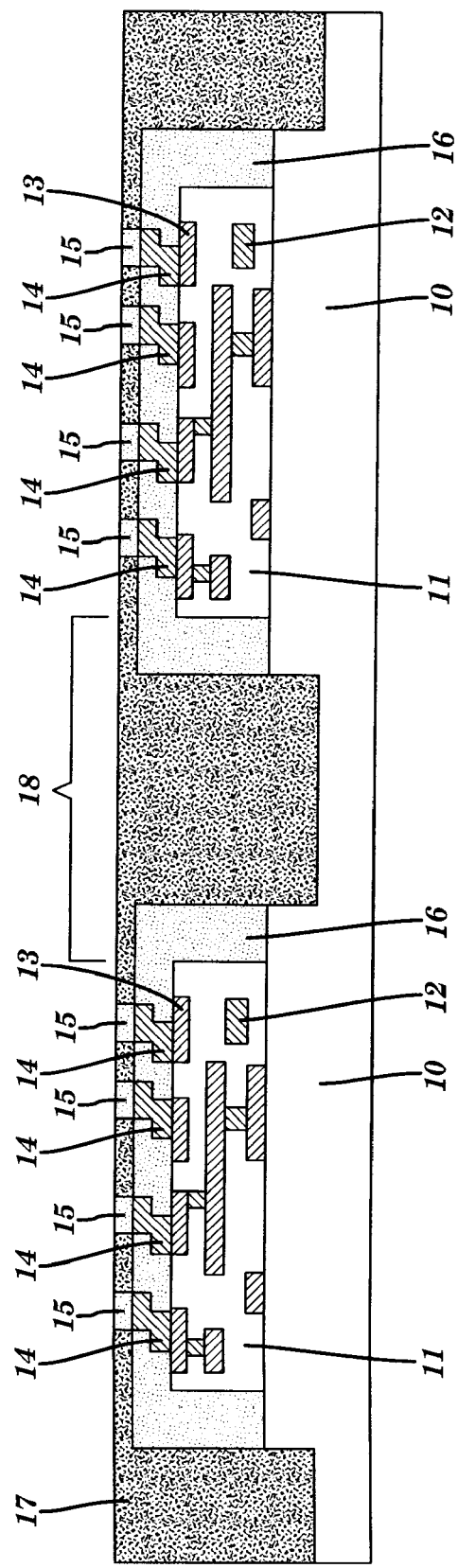
FIG. 2 illustrates another embodiment of the present invention in which the compliant layer terminates perpendicular to and onto the substrate, and the final passivation layer terminates adjacent to a previously diced substrate.

In the structure of FIG. 1, the hard passivation layer 17 is terminated on the substrate 10, forming a hermetic seal on the top surface of the substrate. FIG. 2 differs from FIG. 1 in that the hard passivation layer 17 forms an edge seal such that it encapsulates the entire substrate 10. The structure of FIG. 2 may be formed by a method similar to the method for forming the structure of FIG. 1, except that the channel must be etched at least partially through substrate 10, thereby exposing sidewalls of the substrate.

Figure 3:
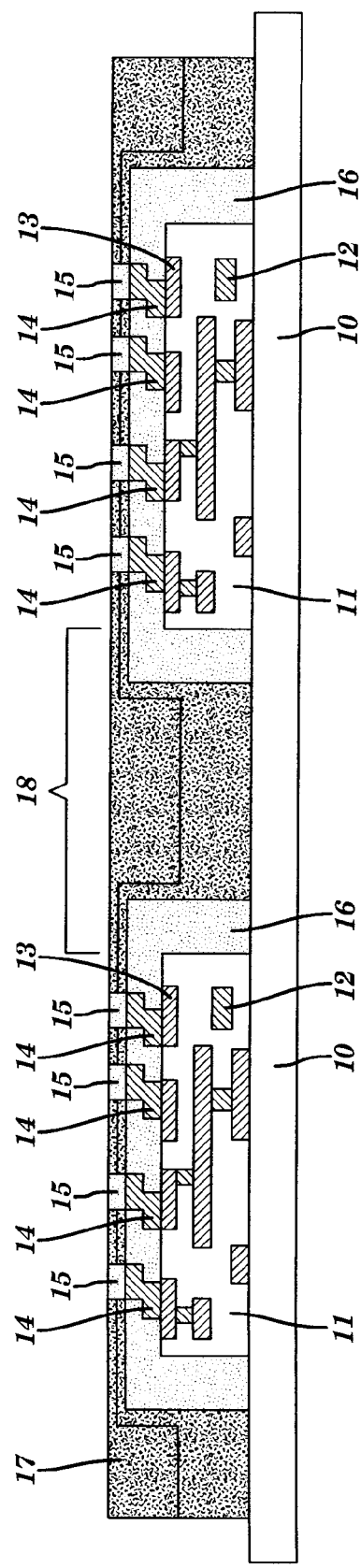
FIG. 3 illustrates another embodiment of the present invention in which the final passivation layer comprises a plurality of layers.

FIG. 3 illustrates another embodiment of the present invention, which differs from FIG. 2, in that the hard passivation layer includes a plurality of layers.

The structure and method of this invention may be used not only for die isolation, but also may be used for isolation of different macros on a die. The structure and method of this invention also may be used on the package rather than on the chip, providing similar mechanical isolation function.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A method of forming an edge seal structure on an integrated circuit chip formed on a substrate, the method comprising: etching a channel in a kerf region surrounding the integrated circuit chip, thereby exposing sidewalls of the integrated circuit chip; depositing a planarizing layer of first dielectric material on the integrated circuit chip and in the channel; and depositing at least one second dielectric material over the first dielectric material, wherein the first dielectric material has a $G_c$ value of at least about 10 times greater than the second dielectric material.

2. The method of claim 1, further comprising the step of embedding conductors in the first dielectric material and the second dielectric material.

3. The method of claim 1, wherein the first dielectric material has a $G_c$ value greater than about 0.1 kJ/m.sup.2.

4. The method of claim 1, wherein the first dielectric material has a $G_c$ value of about 0.5 to about 2.5 kJ/m.sup.2.

5. The method of claim 1, wherein the second dielectric material has a $G_c$ value less than about 0.05 kJ/m.sup.2.

6. The method of claim 1, wherein the second dielectric material has a $G_c$ value of about 0.005 to about 0.05 kJ/m.sup.2.

7. The method of claim 1, wherein the first dielectric material has a tensile strength of about 20 to 100 MPa.

8. The method of claim 1, wherein the second dielectric material has a tensile strength of about 700 to 10,000 MPa.

9. The method of claim 1, wherein the first dielectric material is selected from the group consisting of polyesters, phenolics, polyimides, polysulfones, polyether ether ketones, polyurethanes, epoxies, polyarylene ethers, and polyethylene terepthalates.

10. The method of claim 1, wherein the first dielectric material is a polyarylene ether.

11. The method of claim 1, wherein the second dielectric material is selected from the group consisting of SiN, $SiO_2$, SiC, TEOS, FTEOS, FSG, and OSG.

12. The method of claim 1, wherein the second dielectric material is $SiO_2$.

13. The method of claim 1, wherein the channel exposes sidewalls of the integrated circuits and sidewalls of the substrate.

14. The method of claim 1, wherein said at least second dielectric material comprises a plurality of layers of dielectric material.

15. The method of claim 14, wherein at least one of said layers of second dielectric material is $SiO_2$, and at least one of said layers of second dielectric material is $SiN_x$.

* * * * *